(12) United States Patent
Selten et al.

(10) Patent No.: US 12,520,602 B2
(45) Date of Patent: Jan. 6, 2026

(54) PHOTOVOLTAIC PANEL

(71) Applicant: Solarge Holding B.V., Eindhoven (NL)

(72) Inventors: Wilhelmus Nicolaas Maria Selten, Erp (NL); Stefan Henricus Maria Zwegers, Eindhoven (NL); Martin Dinant Bijker, Helmond (NL); Gerardus Leonardus Antonius De Leede, Weert (NL); Huibert Johan Van Den Heuvel, Eindhoven (NL)

(73) Assignee: SOLARGE HOLDING B.V., Eindhoven (NL)

( * ) Notice: Subject to any disclaimer, the term of this patent is extended or adjusted under 35 U.S.C. 154(b) by 601 days.

(21) Appl. No.: 17/426,544

(22) PCT Filed: Jul. 26, 2019

(86) PCT No.: PCT/NL2019/050498
§ 371 (c)(1),
(2) Date: Jul. 28, 2021

(87) PCT Pub. No.: WO2020/159358
PCT Pub. Date: Aug. 6, 2020

(65) Prior Publication Data
US 2022/0059713 A1 Feb. 24, 2022

(30) Foreign Application Priority Data
Jan. 29, 2019 (NL) ..................................... 2022468

(51) Int. Cl.
*H10F 19/75* (2025.01)
*H10F 19/80* (2025.01)
(Continued)

(52) U.S. Cl.
CPC .......... *H10F 19/804* (2025.01); *H10F 19/75* (2025.01); *H10F 19/85* (2025.01); *H10F 19/902* (2025.01); *H10F 71/00* (2025.01); *H10F 77/68* (2025.01)

(58) Field of Classification Search
None
See application file for complete search history.

(56) References Cited

U.S. PATENT DOCUMENTS

| 5,707,459 A | * | 1/1998 | Itoyama | ................ H01L 31/049 136/251 |
| 2011/0155222 A1 | * | 6/2011 | Ehbing | ............. B32B 17/10788 156/60 |

(Continued)

FOREIGN PATENT DOCUMENTS

| DE | 10102918 A1 | 7/2002 |
| DE | 102009014348 A1 | 12/2009 |

(Continued)

OTHER PUBLICATIONS

European Patent Office, International Search Report in corresponding International Application No. PCT/NL2019/050498, dated Jan. 9, 2020 (7 pages).

*Primary Examiner* — Jayne L Mershon
(74) *Attorney, Agent, or Firm* — CANTOR COLBURN LLP

(57) ABSTRACT

The present disclosure concerns a photovoltaic sandwich panel (1) comprising a photovoltaic element layer (2) provided between a protective front layer (3), and a fiber reinforced back layer (4), wherein: the protective front layer is formed from a compound comprising a first thermoplastic polymer (PI); and the fiber reinforced back layer comprises a second thermoplastic polymer (P2) with a fibrous filler (Continued)

material (F). The disclosure further concerns a method for manufacturing a photovoltaic sandwich panel and an assembly of said panels.

15 Claims, 10 Drawing Sheets

(51) Int. Cl.
*H10F 19/85* (2025.01)
*H10F 19/90* (2025.01)
*H10F 71/00* (2025.01)
*H10F 77/63* (2025.01)

(56) References Cited

U.S. PATENT DOCUMENTS

| | | | |
|---|---|---|---|
| 2011/0300664 A1* | 12/2011 | Chung | H10F 19/906 257/E31.117 |
| 2012/0204952 A1* | 8/2012 | Kim | H01L 31/02164 427/157 |
| 2012/0260587 A1* | 10/2012 | Pini | H02S 20/26 52/173.3 |
| 2013/0206206 A1* | 8/2013 | Bjorneklett | F24S 25/33 136/246 |
| 2014/0144491 A1* | 5/2014 | Galliano | H02S 20/25 438/57 |
| 2014/0370643 A1* | 12/2014 | Stern | H01L 31/02363 252/79.3 |
| 2020/0131783 A1* | 4/2020 | Liu | B32B 27/18 |
| 2021/0305445 A1* | 9/2021 | Van Giesen | H10F 19/85 |

FOREIGN PATENT DOCUMENTS

| | | |
|---|---|---|
| DE | 102008062286 A1 | 6/2010 |
| EP | 2680317 A1 | 1/2014 |
| WO | WO 2021-053180 A1 | 3/2021 |

* cited by examiner

PHOTOVOLTAIC PANEL

CROSS-REFERENCE TO RELATED APPLICATIONS

This patent application is a U.S. National Phase of PCT International Application No. PCT/NL2019/050498, filed Jul. 26, 2019, which claims priority to Netherlands Application No. 2022468, filed Jan. 29, 2019, which are both expressly incorporated by reference in their entireties, including any references contained therein.

TECHNICAL FIELD AND BACKGROUND

The present disclosure relates to solar panels and to a method for the manufacturing thereof The presently disclosed invention was made by or on behalf of the below-listed parties to a joint research agreement. The joint research agreement was in effect on or before the date the claimed invention was made, and the claimed invention was made as a result of activities undertaken within the scope of the joint research agreement. The parties to the joint research agreement are SABIC Global Technologies B.V. and Solarge International B.V.

Known photovoltaic panels, also known as solar panels, typically comprise, in order from the front light-receiving side to the back non-light-receiving side: a protective front layer, a layer comprising interconnected photovoltaic elements and a back layer. Typically these layers are joined together in a thermal lamination process using encapsulant layers. In known photovoltaic panels the photovoltaic elements are typically sandwiched between a top encapsulant layer and a back encapsulant layer. Alternatively just one thicker encapsulating layer may be used which then incorporates the photovoltaic elements. Glass panels are widely used as protective front panels as glass is particularly suitable to, in use, protect the photovoltaic panels from externally induced damage, e.g. due to weather conditions such as rain and hail, while being sufficiently transparent to allow incident light to reach the photovoltaic cells. The back panel may also be a glass sheet, or a metal sheet or any other panel such as polymer-based panels suitable to its purpose of providing electrical insulation of the photovoltaic elements and providing a weather tight closure to the back of the photovoltaic elements.

A disadvantage of using glass panels is the resulting weight of formed photovoltaic panels that is due to the relatively large specific weight of glass, in combination with the requirement of a practical minimum thickness. Heavy photovoltaic panels are disadvantageous, because a large weight complicates transport and assembly of such panels. Protective polymer-based front layers may be used, especially in combination with polymer-based back panels, to manufacture photovoltaic panels with reduced weight.

It is however a drawback of panels with a polymer-based protective front sheet is that they tend to be non-planar or to bend to such an extent that this hinders assembly of such panels, e.g. on a flat roof.

The photovoltaic sandwich panel according the present disclosure mitigates one or more of the above or other problems.

SUMMARY

Aspects of the present disclosure relate to a photovoltaic sandwich panel comprising a photovoltaic element layer. The photovoltaic element layer is provided between a protective front layer, and a reinforced back layer. The protective front layer is formed from a compound comprising a first thermoplastic polymer. The reinforced back layer is a compound material comprising a second thermoplastic polymer and a reinforcement material, preferably a fibrous reinforcement material.

A further aspect of the present disclosure relates to a method for manufacturing a photovoltaic sandwich panel. The method comprises: providing a photovoltaic element, providing a protective front layer; providing a fiber reinforced back layer. The method further comprises adhering the photovoltaic element between the protective front layer and the fiber reinforced back layer form a stack (S) comprising a photovoltaic element layer sandwiched between a protective front layer and a fiber reinforced back layer. Optionally, adhering may be provided by gluing. Preferably, the adhering is provided by laminating, e.g. with encapsulation foils between each pair of subsequent layers to. Alternatively, this may be achieved with a single encapsulation foil with a thickness sufficient to encapsulate the photovoltaic elements to form the photovoltaic element layer therewith. Accordingly, the method may further comprise providing one or more encapsulation foils. Preferably, laminating is performed using: a temperature above a glass transition temperature of the encapsulation foils and below a melting temperature of the protective front layer and fiber reinforced back layer for a time and at a lamination pressure sufficient to provide a good adhesion between the layers.

A further aspect of the present disclosure relates to an assembly comprising at least a first and a second adjacent photovoltaic sandwich panel and a rail for mounting the panels to a carrier.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1A:
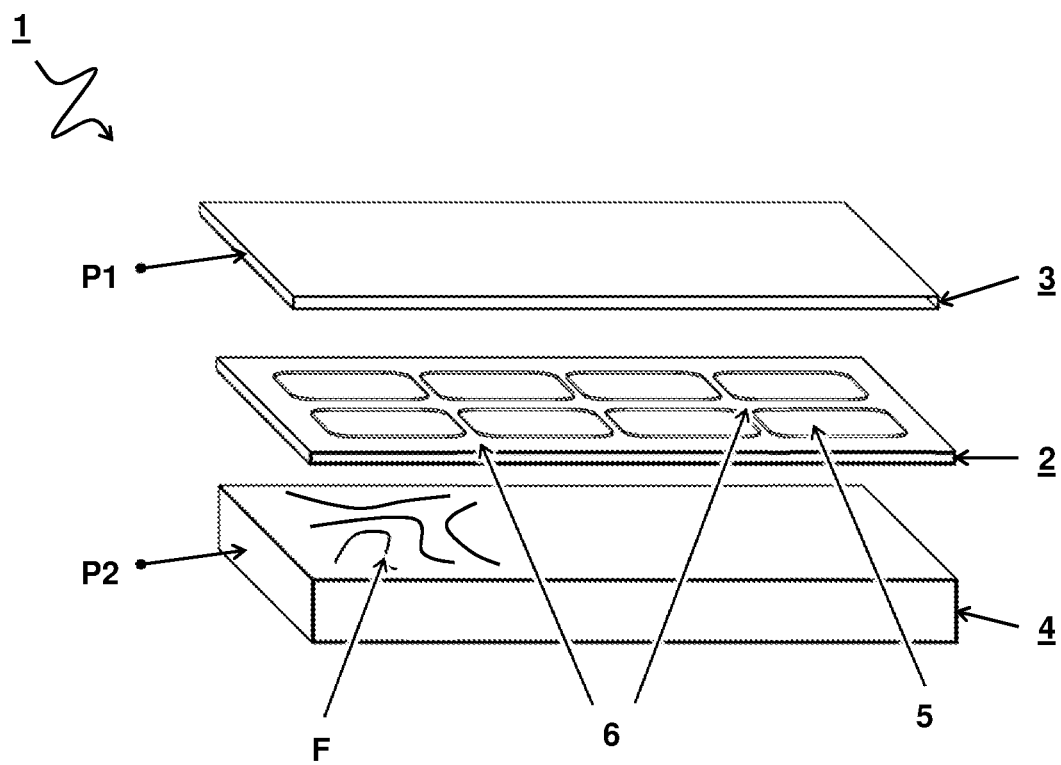
FIG. 1A and 1B schematically depict an exploded view of a photovoltaic sandwich panel.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

As used herein photovoltaic cells be rigid cells, such as crystalline silicon solar cells (c-Si). c-Si cell thickness typically is in a range between 0.15 and 0.25 mm. Alternatively, the photovoltaic cells can be flexible in nature, such as thin film silicon, CIGS (Copper indium gallium selenide cells), OPV (Organic PhotoVoltaic cells) or Perovskite solar cells, comprising a thin photovoltaic layer on a carrier, e.g. polymer or metal.

As used herein encapsulant layers are typically used with a thickness in a range between 0.05 and 2 mm, such as 1.2 mm, 1.1 mm 1 mm and 0.09 mm. Preferably, encapsulant layers may be thinner e.g. in a range between 0.2 mm and 0.5 mm, e.g. 0.4 mm.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

FIG. 1A depicts an exploded view of a photovoltaic sandwich panel 1 comprising a photovoltaic element layer 2 comprising photovoltaic cells 5 and an encapsulant 6 provided between a protective front layer 3, and a fiber F reinforced back layer 4. The protective front layer is formed from a compound comprising a first thermoplastic polymer P1. The fiber reinforced back layer comprises a second thermoplastic polymer P2 with a fibrous filler material F.

Suitable reinforcement materials include natural materials such as (exfoliated) clay, natural fibers and synthetic materials such as carbon fibers, steel fibers, glass fibers and mineral fibers such as basalt fibers. In a preferred embodiment, the fibrous filler material is a glass fiber F as glass fiber reinforced thermoplastic materials may be widely available, available at a low cost and may be recyclable. Advantageously, fiber reinforced back layer comprising glass fibers may be optically transparent. In a photovoltaic sandwich panel comprising a transparent fiber reinforced back layer 4 areas adjacent the photovoltaic cells 5 may be transparent. in other word in such panels 1, light may shine though the panel 1 at areas not covered by a photovoltaic cell 5.

In some preferred embodiments, the fiber reinforced back layer 4 comprises one or more fiber reinforced sheets with a layer thickness in a range between 0.1 mm and 2 mm, preferably between 0.2 mm to 1 mm, e.g. 0.4 mm or 0.5 mm. The fibers in the one or more fiber reinforced sheets may be randomly oriented. Preferably, the fibers within a reinforced sheet are uni-directionally oriented. By aligning the fibers with a sheet higher tensile strengths may be obtained for a given quantity of fiber content. Preferably, the fiber reinforced back layer 4 comprises two or more fiber reinforced sheets in a cross ply orientation. By using cross ply oriented fiber reinforced sheets the reinforced back layer may have similar tensile strength in all directions along its surface as opposed to reinforced back layers having the fibers largely oriented along a single direction.

Optionally the first and second thermoplastic polymer P1,P2 may be different from each other, e.g. one of the layers may be polypropylene (PP) based, whereas the other may be poly(ethylene terephthalate) (PET), Preferably, the protective front layer and fiber reinforced back layer comprise the similar thermoplastic polymers, preferably the same. In other words, preferably the first and second thermoplastic polymer P1,P2 are similar polymers, preferably the same type of polymer. By sandwiching the photovoltaic element layer 2 between two layers comprising the same type of polymer adhesion may be improved, e.g. the encapsulant may be optimized for adhesive properties to one type of polymer rather than a multitude of polymers. Preferably, the first and second thermoplastic polymers P1,P2 are polypropylene based, e.g PP.

In a preferred embodiment, the fiber reinforced back layer 4 is provided with a thickness between 3 and 200 mm, e.g. 4 mm or 150 mm, optionally between 10 and 100 mm, e.g. 13 mm or 50 mm. It will be appreciated that the thickness may vary with desired specifications as will become clear herein below.

In another or further preferred embodiment, the photovoltaic sandwich panel 1 has a weight in a range between 1 and 50 kg/m$^2$, preferably between 5 kg/m$^2$ and 25 kg/m$^2$, most preferably between 2 kg/m$^2$ and 10 kg/m$^2$. Advantageously, said panels 1 may be used in solar energy harvesting applications. For example said panels 1, and/or an assembly of a plurality thereof may be used in the field. Alternatively or in addition said panels 1, and/or an assembly of a plurality thereof may be used on a roof, e.g. a sloped roof or a flat roof, corrugated roof, or as a (part of) a facade, e.g. of a building. Advantageously, the photovoltaic sandwich panel 1 may form a construction element, preferably a construction panel, e.g. a roof panel for closing a roof opening in a construction, e.g. building. In some preferred embodiments the photovoltaic element layer 2 comprises an encapsulant and a plurality of photovoltaic cells 5, preferably electrically connected photovoltaic cells 5. The encapsulant may provide sufficient adhesion to connect the layers within the photovoltaic sandwich panel 1.

Optionally the encapsulant may be provided with an adhesion promotor. Alternatively, fiber reinforced back layer 4 and protective front layer 3 may be glued to photovoltaic element layer 2.

Typically, the encapsulant comprises a thermoplastic elastomer. Upon heating, the encapsulant may become malleable, so that, upon cooling, it connects the layers within the photovoltaic sandwich panel 1. In a preferred embodiment the photovoltaic cells in the photovoltaic element layer 2 are encapsulated in a thermoplastic encapsulant. Advantageously, the photovoltaic cells may be removed, e.g. recovered during a recycling process, from the photovoltaic element layer 2 by heating the layer to a temperature above melting temperature of the encapsulant.

In a preferred embodiment, the encapsulant is formed of a thermosetting composition, e.g. a composition comprising a thermally activated cross linking agent. At temperatures above an activation temperature ($T_{act}$) the composition, e.g. the cross-linking agent, activates and the composition sets. A composition that has not been set, e.g. a composition that has been kept below its activation temperature, remains processable, e.g. malleable and/or plasticizable. Inventors found that cross-linking (setting) the encapsulant improves adhesion between layers within the photovoltaic sandwich panel 1, particularly during high temperature conditions. Improved adhesion may be particularly beneficial for panels that are to be used in high temperature environments and/or in situations wherein panels are temporarily exposed to temperatures close to, or even above, a plasticizing or even melting temperature of a comparable encapsulant composition that is a thermoplastic composition, i.e. not-cross linked. Such conductions include external influences such as incident heat but also internal influences such as resistive heat generated by current passing areas with increased resistance, e.g. due to shadows covering part of the photovoltaic cells in a string or by current passed a (partially) damaged photovoltaic cell. Use of a thermosetting encapsulant contributes to a thermal stabilization of the photovoltaic sandwich panel 1.

In another or further preferred embodiment, an outer surface of the protective front layer 3 in the photovoltaic sandwich panel 1 (i.e. the light receiving side) is provided with a micro-patterned relief structure. Provision of a suitable relief structure may contribute to capturing and/or homogeneous distribution of incident light towards the underlying photovoltaic cells. Further, provision of a microstructure may contribute to self-cleansing properties of a photovoltaic sandwich panel 1. As such, the microstructure may reduce adhesion of external contaminants, e.g. dust or other dirt, onto a surface of an assembled panel, e.g. on a slanted roof.

The micro-patterned relief structure may be provided by an additional cover sheet. Preferably, the micro-patterned relief structure is provided, e.g. embossed, directly onto the protective front layer 3. The micro-patterned relief structure may be provided to the protective front layer 3 in a separate manufacturing step, e.g. before adhering the protective front layer to the panel. Optionally the micro-patterned relief structure is provided to the protective front layer 3 in a post-treatment procedure, e.g. by roll embossing of a micro structure. Preferably, the micro-patterned relief structure is provided during manufacturing of the panel, e.g. during a laminating step, as will be explained herein below in the section detailing the manufacturing method.

In some preferred embodiments, the photovoltaic element layer 2 is formed of a thermosetting composition, e.g. comprises a thermally activated cross linking agent. Provision of a cross-linker to the protective front layer 3 may improve thermal stability of the micro-patterned relief structure.

Figure 1B:
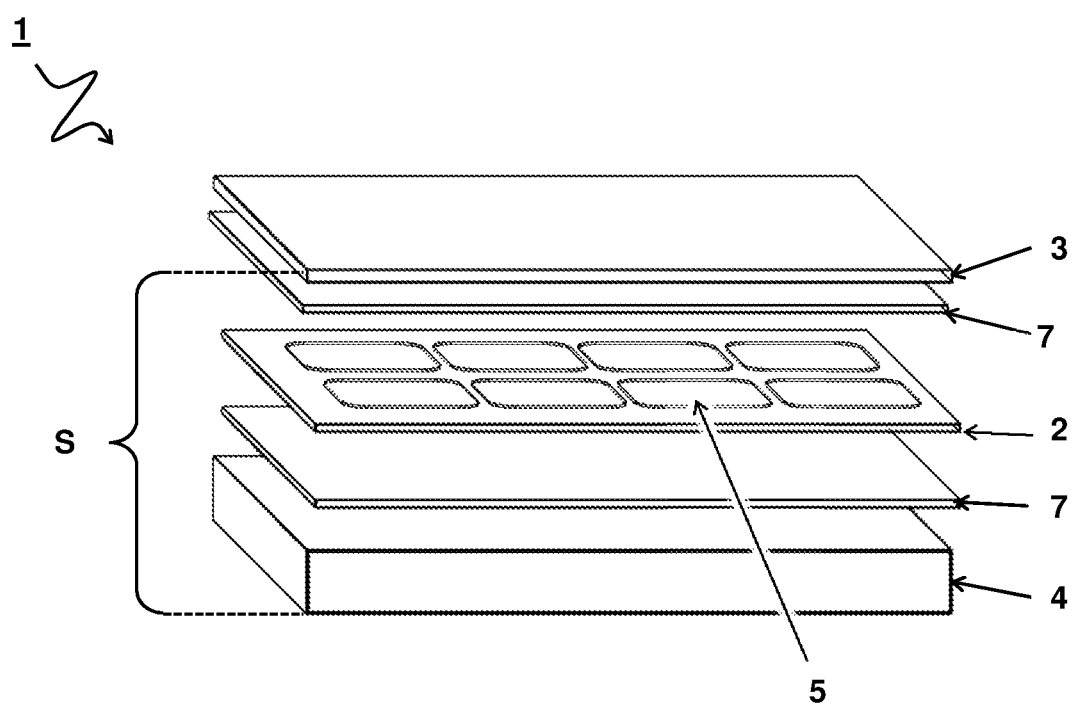

In a preferred embodiment, the photovoltaic element layer 2 is provided between the protective front layer 3 and the fiber reinforced back layer 4 to form a stack S of layers, e.g. as depicted in FIG. 1B. Preferably, the photovoltaic element layer 2 is laminated between the protective front layer 3 and the fiber reinforced back layer 4 to form a laminated stack S of layers. Laminating ensures good adhesion between the layers in the stack S. Alternatively the photovoltaic element layer 2 may be glued between the protective front layer 3 and the fiber reinforced back layer 4 to form a stack S of layers.

In another or further preferred embodiment, e.g. as schematically depicted in FIG. 1B, a photovoltaic sandwich panel 1 formed of a stack S of layers wherein a respective encapsulation foil 7 is provided between each pair of layers. Preferably, a melting temperature and/or glass transition temperature of the encapsulation foils 7 is below a melting temperature of the thermoplastic polymer comprised in the protective front layer 3 and below a melting temperature of the thermoplastic polymer comprised in the fiber reinforced back layer 4. Alternatively, the melting temperature may be close to a melting temperature of the thermoplastic polymer in the protective front layer and a melting temperature of the thermoplastic polymer comprised in the fiber reinforced back layer as long as the stack S may be laminated at a temperature without substantially deforming one or more of the front and back layer 3,4, e.g. by providing a suitable combination of laminating temperature and thin layers of encapsulant with respect to the front and back layers.

In some preferred embodiments, the encapsulation foils 7 preferably comprises a polyolefin PO, e.g. a thermoplastic polyolefin (TPO), such as ethylene vinyl acetate (EVA). Inventors observed that encapsulation foils 7 comprising PO form an adhesive bond with each of the thermoplastic polymer layers between which they are arranged. Inventors found especially strong laminate formation between polypropylene comprising layers (PP). Without being bound to theory inventors believe PO and EVA encapsulation foils encapsulation foils 7 provide improved adhesion to PP-comprising layers after lamination. In another or further embodiment, adhesion may be further improved by selecting encapsulation foil 7 provided with a layer of adhesion promotor, e.g. as in commercially available encapsulation foils such as Yparex and DNPZ86. Advantageously, the use of thermoplastic encapsulation foils enables re-use (recycling) of the panels and/or its components. Lamination is particular advantageous in the manufacturing of photovoltaic sandwich panels 1 with relatively large dimensions, e.g. larger than conventional panels, e.g. using glass front layer and/or back layers. Use of light weight materials improves handling, e.g. during manufacture, transport, and/or installation. Accordingly, in some preferred embodiments the photovoltaic sandwich panels have a dimension L×W, with L in range between 1 to 15 meters and W in a range between 0.5 and 2.5 meters. For example the present disclosure envisions photovoltaic sandwich panels 1 with a length of 12 meters and/or photovoltaic sandwich panels with a width of 2.4 meters. Alternatively, the panels may be provided at longer lengths in which case the panel is preferably adapted to be rolled up. Dimensions of a photovoltaic sandwich panel (1) may be tuned according to construction standards and/or according to specific dimensions of a particular building design. The use of relatively large panels may advantageously reduce the installation effort, installation time and/or cost. The use of relatively large panels may further reduce the number of electrical connections needed, e.g. to electrically connect a mounted PV solar energy harvesting assembly.

In another or further preferred embodiment at least a first edge portion of the photovoltaic sandwich panel 1 is a reinforced edge. The reinforced edge may form a weather tight seal along said edge portion. Advantageously, the reinforced edge may protect the photovoltaic cells from weather influences. Advantageously, the reinforced edge may further protect the sandwich panel from delamination by weather influences. The reinforced edge may further prevent (bio)fouling, e.g. prevent growth of moss and/or algae e.g. along an edge portion of the photovoltaic sandwich panel 1.

Figure 2A:
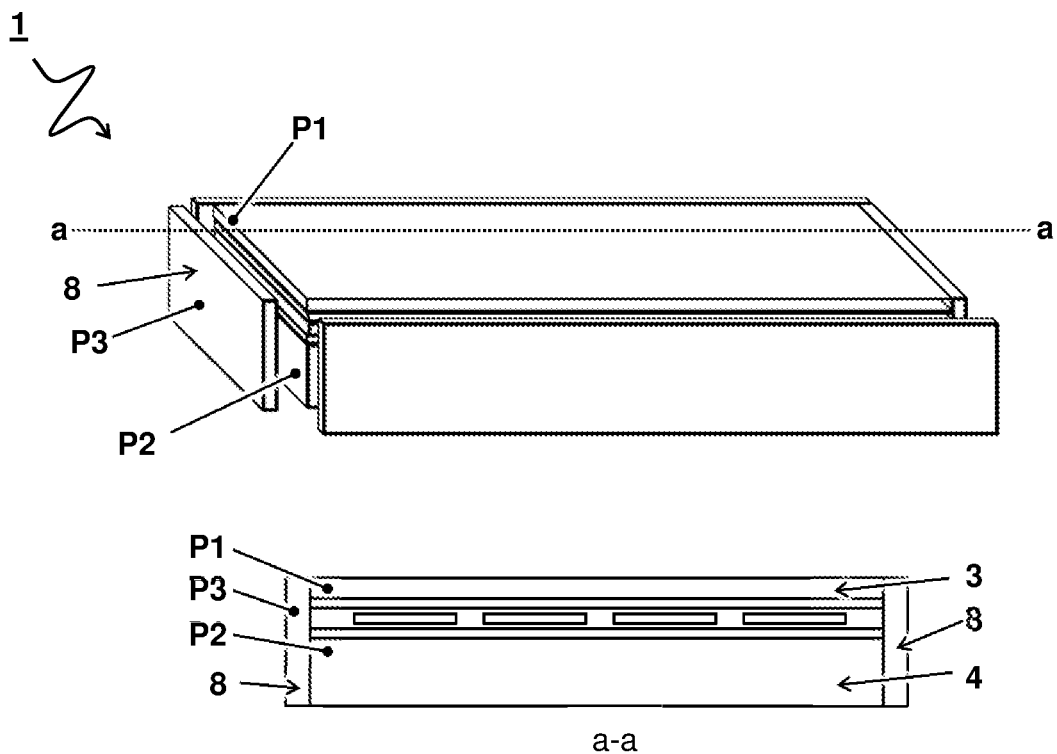
FIG. 2A and 2B schematically depict perspective and cross-section side views of a photovoltaic sandwich panel with a reinforced edge.

FIG. 2A schematically depicts a perspective view and cross section view of a photovoltaic sandwich panel 1 comprising a protective front layer 3 comprising a first thermoplastic polymer P1 and a fiber reinforced back layer 4 comprising a second thermoplastic polymer P2. The photovoltaic sandwich panel 1 as shown is provided with reinforcement strips 8 adhered along its edges. The protective front layer 3, the fiber reinforced back layer 4 and the reinforcement strips 8 adhered thereto together encapsulate the photovoltaic sandwich panel 1 to prevent ingress of potentially harmful substances such as moisture from the atmosphere. The reinforcement strip 8 may be adhered to along an edge portion of the photovoltaic sandwich panel 1, e.g. to a side portion of the stack (S) by gluing of fusing. Preferably, the reinforcement strip 8 is fused (welded) to the photovoltaic sandwich panel. By using a reinforcement strip 8 comprising a thermoplastic polymer the strip may be fused with one or more of the thermoplastic polymers comprised in the protective front layer 3 and fiber reinforced back layer 4. Fusing of the reinforcement strip 8 may be provided placing the strip along a side portion of the S and heating the assembly above the melting temperature of the thermoplastic polymers P1, P2, and P3. Preferably heat is applied locally at the location of the strip to avoid heat induced damage to other parts of the photovoltaic sandwich panel 1. Heat may be provided locally by one or more of ultrasonic heating, a heated mold, spot welding, and laser welding. It will be appreciated that other means to weld the reinforcement strip 8 to the photovoltaic sandwich panel 1 may be applied as well.

Preferably, the protective front layer 3, the fiber reinforced back layer 4, and the reinforcement strip 8 comprise the same thermoplastic polymer, or a polymer with a similar melting temperature, e.g. within a range of 10° C., preferably within 5° C. In other words, the first, second and third thermoplastic polymer P1,P2,P3 are the same polymer, e.g. PP-based. Providing the same polymer, or a polymer with a similar melting temperature may allow fusing the reinforcement strip 8 to the photovoltaic sandwich panel 1 without needing to overshoot the melting temperature of the lowest melting thermoplastic polymer, thus avoiding damage.

Optionally, the edge or a section along the edge of the photovoltaic sandwich panel 1 may be provided with a flat surface finish, e.g. by cutting or grinding. Providing a flat surface finish along an edge portion of the stack S may improve adhesion of the reinforcement strip 8 to the flat edge portion of the photovoltaic sandwich panel.

Figure 2B:
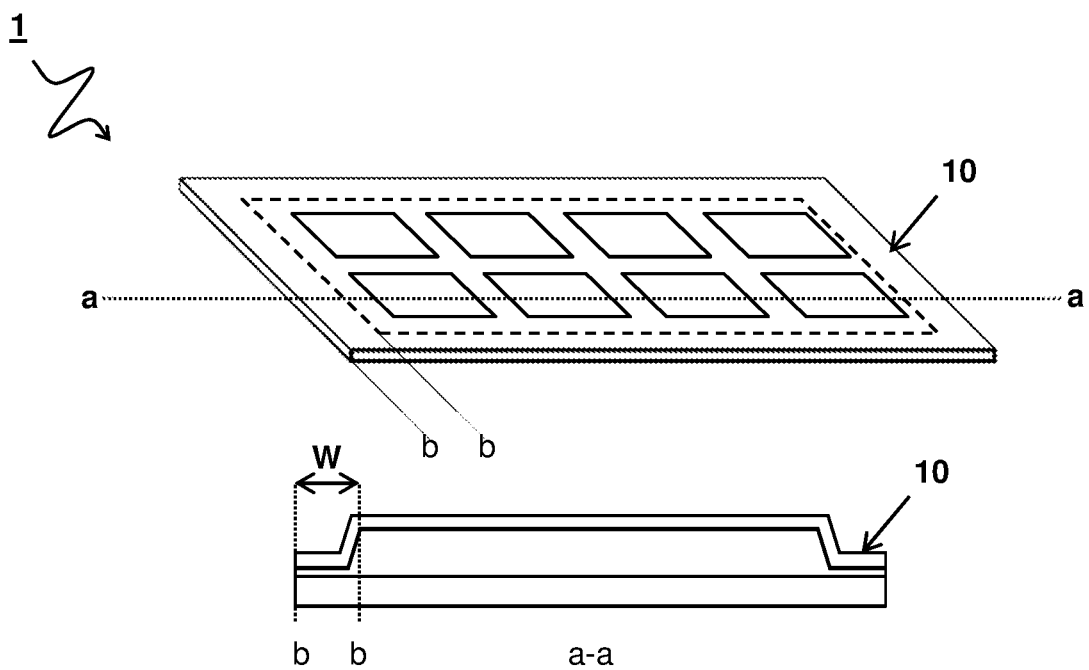

In another or further preferred embodiment, e.g. a shown in FIG. 2B the protective front layer 3 and the fiber reinforced back layer 4 are fused over a width W to form a reinforced edge 10. FIG. 2B schematically depicts a perspective and cross-section side view of a photovoltaic sandwich panel 1 provided with a reinforced edge 10 over a width W. The same method described to fuse the reinforcement strip 8 to the photovoltaic sandwich panel 1 may be applied to an edge portion (over a width W) of the photovoltaic sandwich panel 1 to fuse the thermoplastic polymers comprised in the photovoltaic element layer 2 and protective front layer 3 to directly obtain a reinforced edge 10, e.g. without a separated reinforcement strip 8.

Figure 3A:
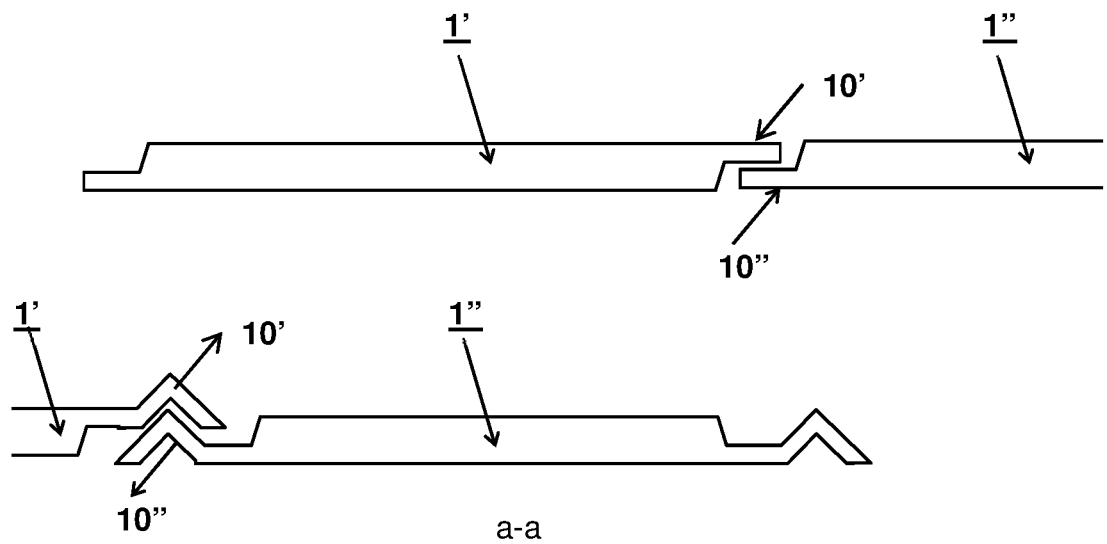
FIG. 3A schematically depicts cross-section side views of exemplary photovoltaic sandwich panels with a formed reinforced edges.

In some preferred embodiments, at least a pair of opposing edges of a panel are reinforced edges 10. Preferably, e.g. as shown in FIG. 3A, the at least a portion of one of the opposing reinforced edges 10' of a first panel 1' is shaped to overlap with a portion of a reinforced edge 10') of a second panel 1". By shaping the reinforced edges of the panel to overlap with a portion of an other panel, panels may be assembled, e.g. mounted on a roof, with overlapping edge portions. By mounting panels with overlapping edges weather influences such as rain may be prevented from reaching the underside of the panels anchor from reaching a carrier the panels or mounted onto. Alternatively or in addition, the panels 1 may be used as construction elements, e.g. in closing a roof opening in a building.

Figure 3B:
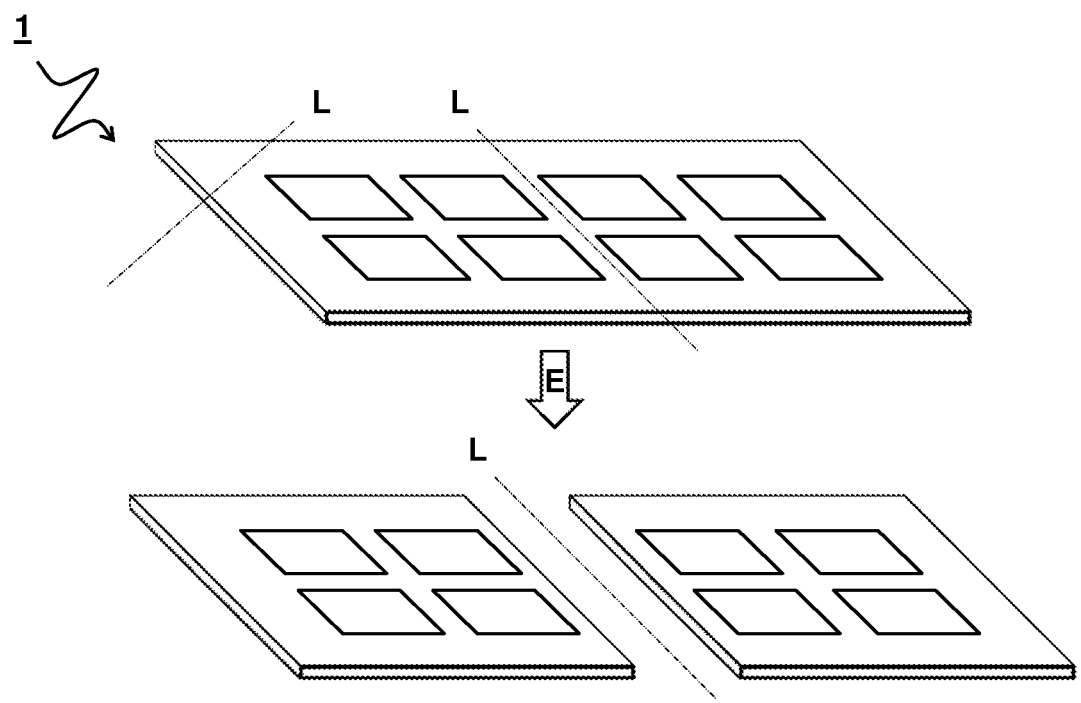
FIG. 3B schematically depicts perspective views of excising a portion of a photovoltaic sandwich panel.

In other or further preferred embodiments, e.g. as shown in FIG. 3B, the photovoltaic sandwich panel 1 is arranged to allow excising E a portion of the photovoltaic sandwich panel 1 along a line L without losing solar energy harvesting functionality of the remaining photovoltaic cells 5. Excising a panel without losing solar energy harvesting functionality of the remaining photovoltaic cells 5 advantageously allows manufacturing of photovoltaic sandwich panel 1 in one or more standard sizes followed by adapting the dimension of the panel 1 to a given demand, e.g. a demand set out by mounting location. For example, the dimension of photovoltaic sandwich panels 1 may be adjusted to match a mounting space, e.g. on a roof. panels may be excises mechanically, e.g. but cutting or milling. Preferably panels may be thermally excised (resized). For example, by a hot blade, by an ultrasonic cutting tool, by laser cutting. It will be appreciated that line L may extend along an edge of the photovoltaic sandwich panel 1 to allow size adjustment if the photovoltaic sandwich panel 1, e.g. during installation of a roof or in a field, e.g. to overcome mounting obstacles. Alternatively or in addition, the photovoltaic cells 5 may be laid out to allow resizing of the photovoltaic sandwich panel 1 between photovoltaic cells of the panel. Alternatively or in addition, photovoltaic sandwich panels 1 may be joined (fused, welded) together. For example two or more photovoltaic sandwich panels 1 may be fused along an edge to form a single larger photovoltaic sandwich panel 1.

Figure 4A:
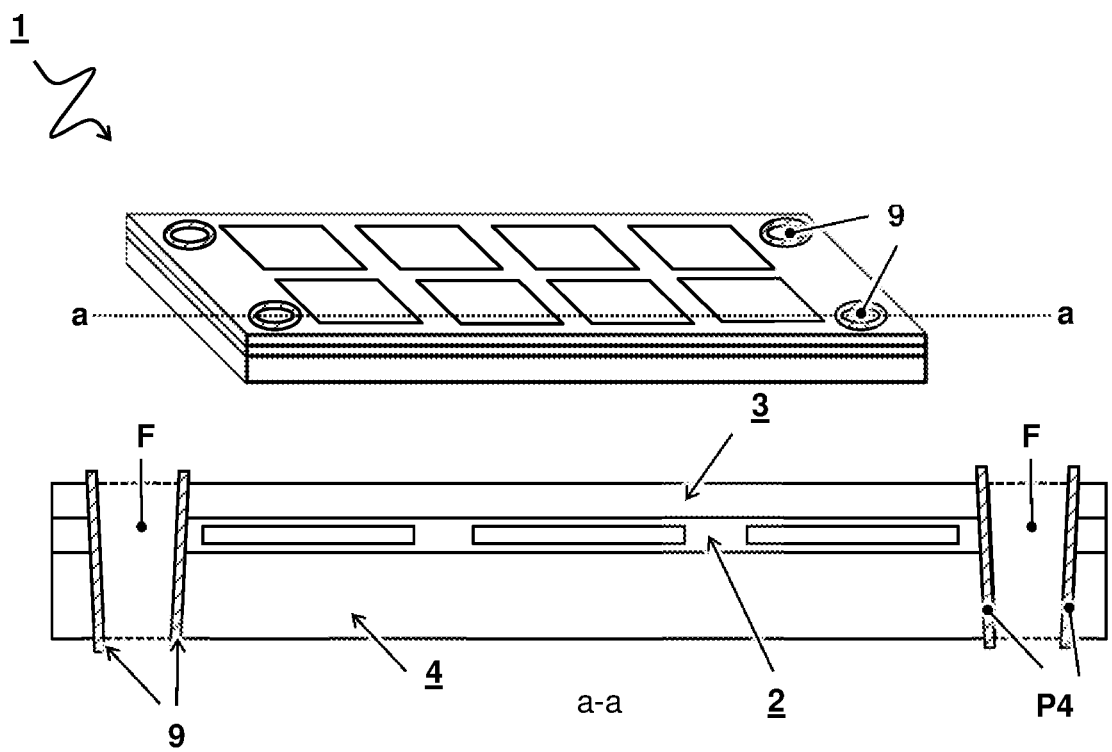
FIG. 4A schematically depicts a perspective and cross-section side view of a photovoltaic sandwich panel comprising a feedthrough.

In other or further preferred embodiments, e.g. as shown in FIG. 4A the photovoltaic sandwich panel 1 comprises a least a first tubule 9, preferably a fiber reinforced tubule to provide a feedthrough (F). Advantageously the feedthrough F may be used as feedthrough for electrical wiring. Alternatively or in addition the feedthrough F may be used by connecting means, e.g. for mounting of the photovoltaic sandwich panel 1 onto a carrier. Preferably, the tubule 9 is fused to at least the protective front layer 3 and the fiber reinforced back layer 4. By fusing the tubule 9 to the front and back layers of photovoltaic sandwich panel 1 a weather (water and moisture) tight seal may be provided. Accordingly the tubule 9 comprises a fourth thermoplastic polymer P4. Preferably the fourth thermoplastic polymer P4 is similar to the first and second thermoplastic polymers P1,P2 or at least has a melting point close to the melting point of the first thermoplastic polymer P1 and second thermoplastic polymer P2. Fusing of the tubule 9 may be achieved by any of the thermal methods described hereinabove or, preferably by friction welding, for example as described in US 2017/0015049. Accordingly, the tubule 9 is preferably provided with a conical shape. Preferably, the tubule 9 is formed from a fiber reinforced compound, e.g. a glass fiber, reinforced compound. By providing the tubule 9 with a tubular shape and/or by reinforcing the tubule 9, the tubule 9 may be rotated and forced into a pre-defined hole wherein the friction between the rotating tubule 9 and sidewall of the hole generates the heat to fuse the tubule with the photovoltaic sandwich panel.

Alternatively or additionally, one or more tubules may be provided that do not fully extend through the panel, but that extend from the photovoltaic element layer 2 through only one of the protective front layer 3 or the fiber reinforced back layer 4. These partial tubules may provide access of electric connections to the photovoltaic element layer 2, for example for power collection or for sensor signal lines e.g. of a temperature sensor.

Figure 4B:
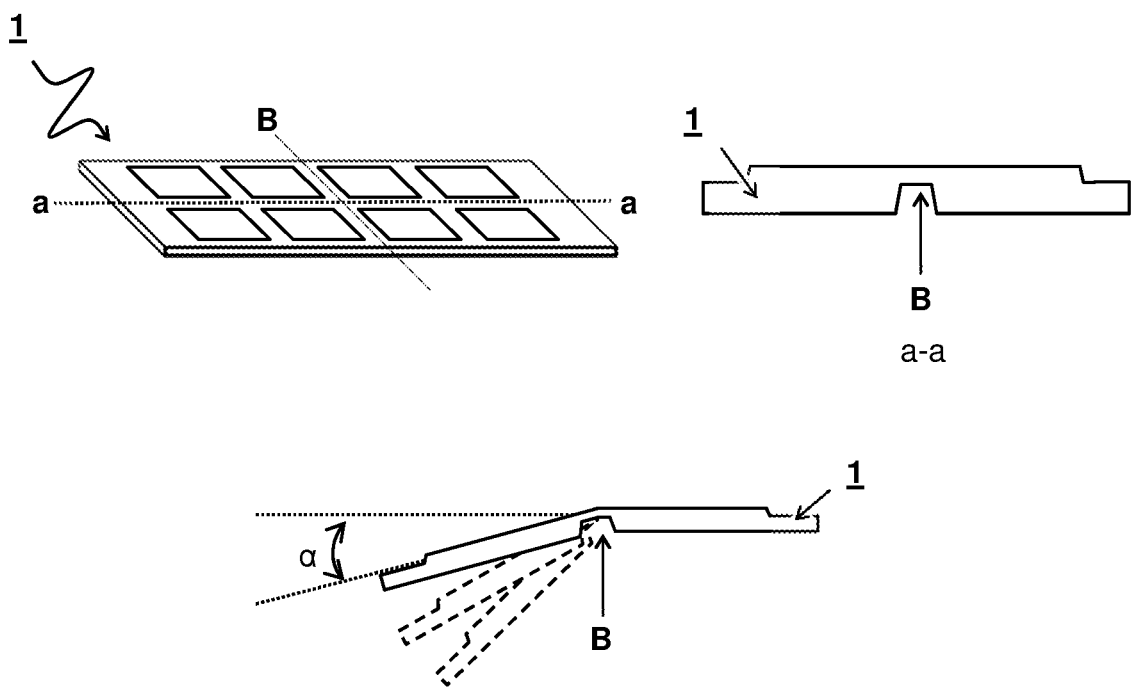
FIG. 4B schematically depicts a perspective and cross-section side views of a flexible photovoltaic sandwich panel.

In another or further preferred embodiment, the photovoltaic sandwich panel 1 is provided with an elongate region with a reduced thickness to enable folding or bending the panel along a line extending within the region in the corresponding elongate direction.. FIG. 4B schematically depicts a perspective view and cross-section side views of a photovoltaic sandwich panel 1 bendable over an angle a along a bending line B. Authors find that by reducing the thickness of the photovoltaic sandwich panel along a line the stiffness of the panel is locally reduced to allow bending of the photovoltaic sandwich panel (1) along said line over an angle in a range between 5° and 120° without losing solar energy harvesting functionality of the panel. By providing the photovoltaic sandwich panel 1 with one or more of such elongate regions, it can be folded to adapt its shape to that of a roof at which it is to be mounted. By using thermoplastic polymers the thickness may reduced without essentially interrupting the fiber reinforcement in the panel, e.g. across the line B. Thus formed photovoltaic sandwich panel 1 may be bent while the respective ends on either end of the bending line remain connected to each other via the reinforcement fibers. To achieve said thickness reduction various thermal methods may be used including but not limited to use of a hot mold, and a hot blade. By locally melting the thermoplastic polymer, e.g. along a line B, material comprised in the photovoltaic sandwich panel 1 may be partially displaced forming a folding line in an elongate region with a reduced thickness. In contrast, forming an elongate region with reduced thickness by removing material, e.g. by cutting, grinding, milling, or the like, breaks the reinforcement fibers within the panel and results in a foldable panel with a reduced strength.

Figure 5A:
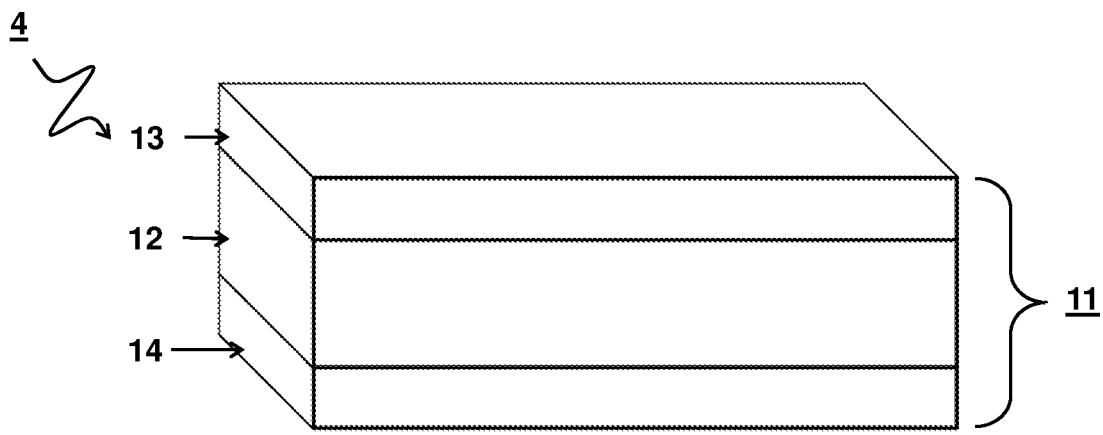
FIG. 5A, 5B and 5C schematically depicts perspective views of a fiber reinforced back layer.
Figure 5B:
Figure 5B:
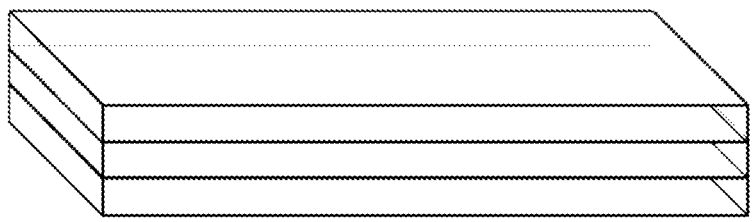

In other or further preferred embodiments the fiber reinforced back layer 4 is a sandwich panel 11 comprising a core layer 12 sandwiched between a fiber reinforced thermoplastic polymer top layer 13 and a fiber reinforced thermoplastic polymer bottom layer 14, e.g. as shown in FIG. 5A.

By using a sandwich panel 11 formed of a fiber reinforced thermoplastic polymer top layer 13 and a fiber reinforced thermoplastic polymer bottom layer 14, separated by a core layer 12, the sandwich panel gains strength and stiffness. By using a stiff fiber reinforced back layer 4 bending, twisting or excessive flexing of the photovoltaic sandwich panel 1 can be avoided. Especially during manufacturing, e.g. during a thermal processing step, e.g. during lamination, use of a stiff fiber reinforced back layer 4 mitigates bending problems. For example, this mitigates bending which tends to result from differing thermo-expansion coefficients within the various layers in the stack in heating and cooling steps, e.g. as used in the lamination process laminating. Preferably, the fiber reinforced thermoplastic polymer top layer 13 and the fiber reinforced thermoplastic polymer bottom layer 14 are formed of a plurality of unidirectional fiber reinforced layers which are stacked in a cross-ply fashion. The fiber reinforced thermoplastic polymer preferably may be the first thermoplastic polymer P1 and/or the second thermoplastic polymer P2. Alternatively the fiber reinforced thermoplastic polymer may be the same or a similar polymer or at least have a melting point close to that of the other thermoplastic polymers in the photovoltaic sandwich panel 1 (P1, P2, P3). The core layer 12 may be a dense layer. Preferably, the core layer 12 is a porous spacer layer. Preferably, the core layer 12 is formed from a thermoplastic polymer. This thermoplastic polymer may be the same or a similar polymer or at least have a melting point close to that of the other thermoplastic polymers in the photovoltaic sandwich panel 1 (P1, P2, P3). Inventors found that a sandwich panel 11 comprising a porous spacer (core) layer may be particularly suitable in photovoltaic sandwich panels 1. In some embodiments the porous layer may be a foam, a closed cell structure or an open cell structure. Advantageously a porous spacer layer 12 (core layer) may be compressed, e.g. molten, from an initial thickness to a reduced thickness. Advantageously, providing a porous spacer layer 12 maintains the advantage of providing a desired stiffness while improving, e.g. reducing, the weight (mass per unit area) needed to attain said stiffness. Providing a porous core layer 12 may further allow using the photovoltaic sandwich panel 1 as an insulation material, e.g when assembled, e.g. when assembled on the roof of a building. In other or further preferred embodiments multiple spacer layers, e.g. porous core layers 12 may be used in a stack, e.g. to improve thermal insulation properties of the panel when installed. Alternatively or in addition porous layers may be added to the bottom of the photovoltaic sandwich panel 1. In some embodiments the core layer 12 may comprise insulation foams usual within the field, such as EPS, OIR and/or PUR foams. Alternatively or in addition, the core layer 12 may comprise biodegradable materials such as hemp fibers and paper (cardboard). In other or further embodiments the pores, e.g. voids, in the porous layer 12 are filled with a gas like Argon, to further reduce convection heat transfer. In other or further embodiments the stack, e.g. the fiber reinforced thermoplastic polymer bottom layer 14, is provided with a radiation reflecting sheet e.g. aluminum foil.

In a preferred embodiment, the porous spacer layer 12 comprises laterally connected pores. Using a core with laterally connected pores allows evacuating air and humidity between layers in the stack, e.g. during manufacturing, e.g. lamination. Applying a vacuum between layers during lamination mitigates evaporation of residues, e.g. humidity (water) and/or solvent traces from the compounds forming the layers. This allows use of stable processing conditions, e.g. lamination conditions. Optionally the voids, e.g. pores may remain evacuated (under vacuum) in the laminated panel. Alternatively, filling with an inert gas, usage of evacuated pores may improve thermal insulation properties of the panel, e.g. during assembly on a building.

Figure 5C:
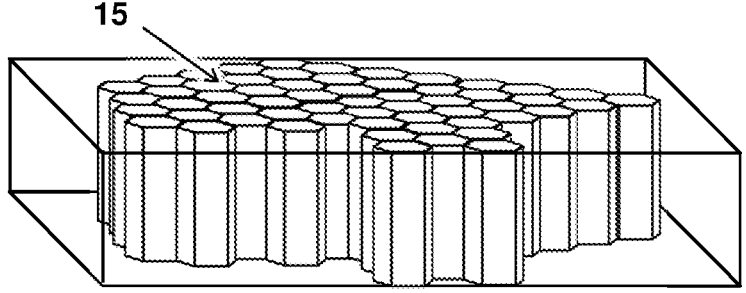

In some preferred embodiments, e.g. as shown in FIG. 5C the core layer 12 is a honeycomb panel 15. Honeycomb panels combine light-weight properties with stable spacing functionality. Advantageously, sandwich panels 11 comprising honeycomb panel 15 sandwiched between a fiber reinforced thermoplastic polymer top layer 13 and a fiber reinforced thermoplastic polymer bottom layer 14, may have a bending stiffness that is independent or nearly independent on bending direction, e.g. the same or nearly the same in a X and Y direction of the panel. Preferably the core layer 12 is formed of a thermoplastic honeycomb panel 15, e.g. such as panels provided by Econcore® and described in a patent application with number WO2006053407. Such thermoplastic honeycomb panels may advantageously be produced from PP in a continuous process. In this process a heated sheet of thermoplastic polymer is molded into a honey-comb shape which gains stability upon cooling below a melting temperature of the sheet. By virtue of the manufacturing process such honeycomb panels 15 possess a closed cell structure in a direction along its manufacturing direction and an open or semi-open porous structure in a direction perpendicular to its manufacturing direction. Advantageously, such honeycomb panel 15 may be formed entirely of thermoplastic polymers, e.g. PP, allowing efficient recycling of said panels, e.g. by melting and re-forming. Advantageously the thickness of the honeycomb panel 15 may be controlled (e.g. set) by mere selection of a suitable mold.

Advantageously, the sandwich panel 11 may be a thermal insulator which may allow application of thermal processes, e.g. manufacturing steps, at a first side of the panel without negatively affecting the opposite side of the panel. This may be particularly useful during manufacturing of the panel by allowing different temperature steps, e.g.

lamination steps or welding steps, on opposing sides of the sandwich panel 11. Further, the temperature insulating sandwich panel 11 may allow heat induced modifications steps as described herein, such as friction induced welding or laser welding, to be applied on a first side of a photovoltaic sandwich panel 1 without negatively affecting the opposing side of the panel, e.g. temperature sensitive elements such as UV protective additives. It will be appreciated that, optionally, the core layer 12 may be formed of a plurality of honeycomb panels 15, a plurality of other types of porous core layers, e.g. foams, or combinations thereof. Likewise, thermal isolation properties of honeycomb panels 15 may optionally be improved by filling the pores with an inert gas or by evacuating the pores.

In another or further preferred embodiment the core layer 12 defines spaces to accommodate electrical components connected to the photovoltaic cells 5. The electrical components may include one or more of: electrical wiring to connect cells and/or wiring to connect adjacent panels, a junction box, a power optimizer, an inverter, diodes or a 'maximum power point tracker'. Advantageously inclusion of electrical components in the fiber reinforced back layer 4 may allow flat mounting of the photovoltaic sandwich panel 1 onto a carrier, e.g. roof. In other words, such panels may be mounted directly onto a roof, and/or mounted over an opening in a building (e.g. used as roof-elements) without the use of rails or spacers. Due to the thermal isolating effect of the porous core layer 12 temperature sensitive elements, such as the photovoltaic cells 5 in the photovoltaic element layer 2, may be shielded from heat generated by the electrical components in the core layer 12. Optionally, wiring connecting the photovoltaic cells 5 may be integrated into the sandwich structure. Optionally or in addition, connectors may be integrated as well, e.g. into the side of the photovoltaic sandwich panel 1. Optionally or in addition, space may be provided in the sandwich panel 11 to integrate a junction box.

Figure 6A:
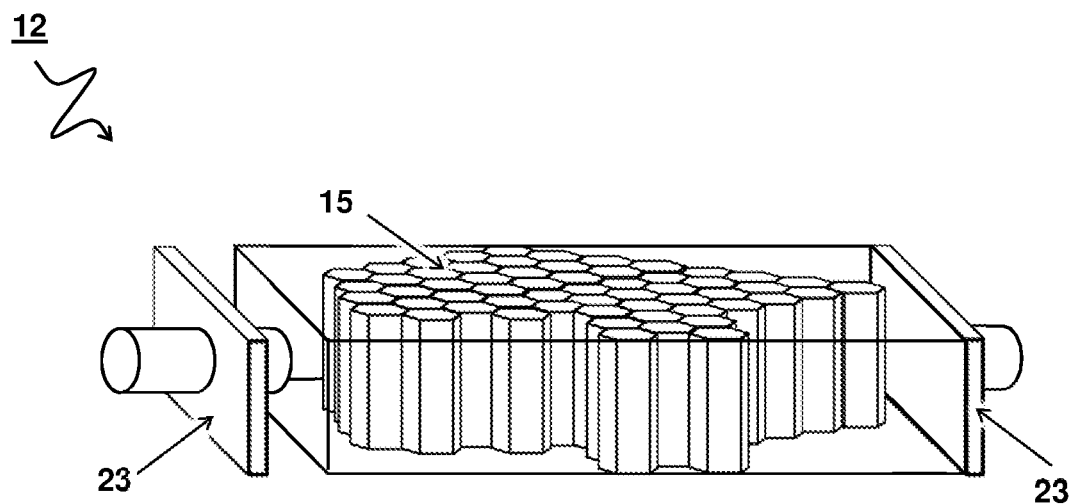
FIG. 6A schematically depicts a perspective view of a honey honeycomb panel with cooling circuitry.

In some embodiments, e.g. as shown in FIG 6A, opposing ends of the sandwich panel 11 are provided with an inlet and outlet 23,24 connected via the laterally connected pores for forming a cooling channel. Advantageously, the laterally connected pores in the core layer 12 of the sandwich panel 11 may form a cooling channel. In other or further embodiments the cooling channel may be part of a cooling circuit, that further includes a pump and a heat exchanger, for example in a warm water supply system. In use, the pump may induce a circulation of a cooling fluid through the cooling circuit for cooling the photovoltaic sandwich panel. Cooling the photovoltaic sandwich panel may positively affect the photovoltaic output of the photovoltaic cells 5. Preferably the cooling channels in the photovoltaic sandwich panel 1 are arranged such that when mounted under an angle (e.g. of a slanted roof) the coolant in the cooling channel may flow through the cooling channel under the influence of gravity. In other words, preferably the cooling channels are oriented in a direction along a slope of the panel when mounted. By providing the core layer 12 with an inlet and outlet 23,24 on opposing ends of the laterally connected pores such a cooling channel may be formed.

In some embodiments the photovoltaic sandwich panel 1 comprises one or more further thermal isolation layers. Preferably, the one or more thermal isolation layers are provided to a face of the photovoltaic sandwich panel 1 that, in use, is pointed towards the carrier, i.e. away from incident light. Said further thermal isolation layers may include one or more of a foam and a heat reflecting foil (e.g. aluminum).

Figure 6B:
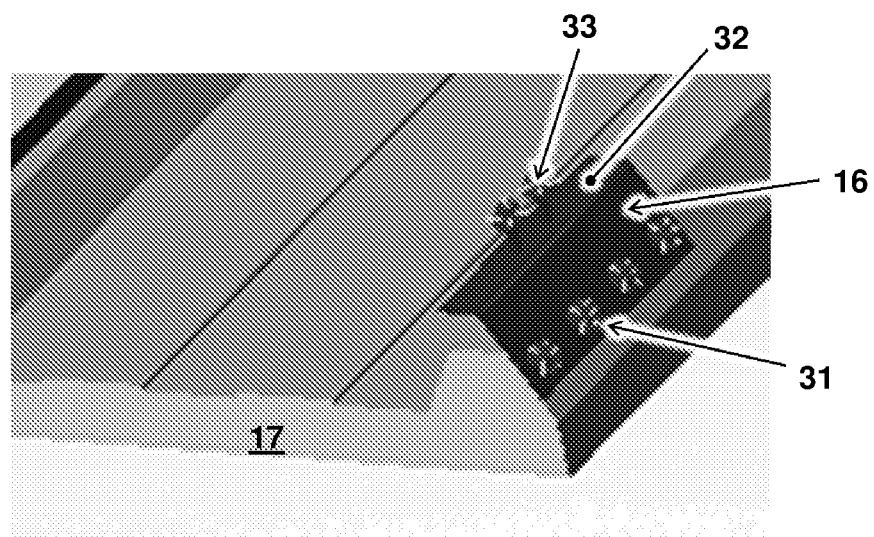
FIG. 6B schematically depicts a perspective view of a carrier and a mounting rail.

FIG. 6B schematically depicts a perspective view of a sheet piling roof section (carrier) 17 onto which a rail 16 is provided. The rail may be bolted 31 directly to the sheet piling. The rail 16 is provided with a portion 32 for mounting the photovoltaic sandwich panel 1. In one embodiment the rail 16 is provided with means 33 for affixing the photovoltaic sandwich panel 1, e.g. holes for a nut and bolt connection. Preferably, the rail protrudes above the roof, e.g. above the sheet piling to provide clearance such that mounted panels overcome unevenness's in the roof, e.g. bolts used to mount the sheet piling to the building. for sheet-pile roof.

Figure 7A:
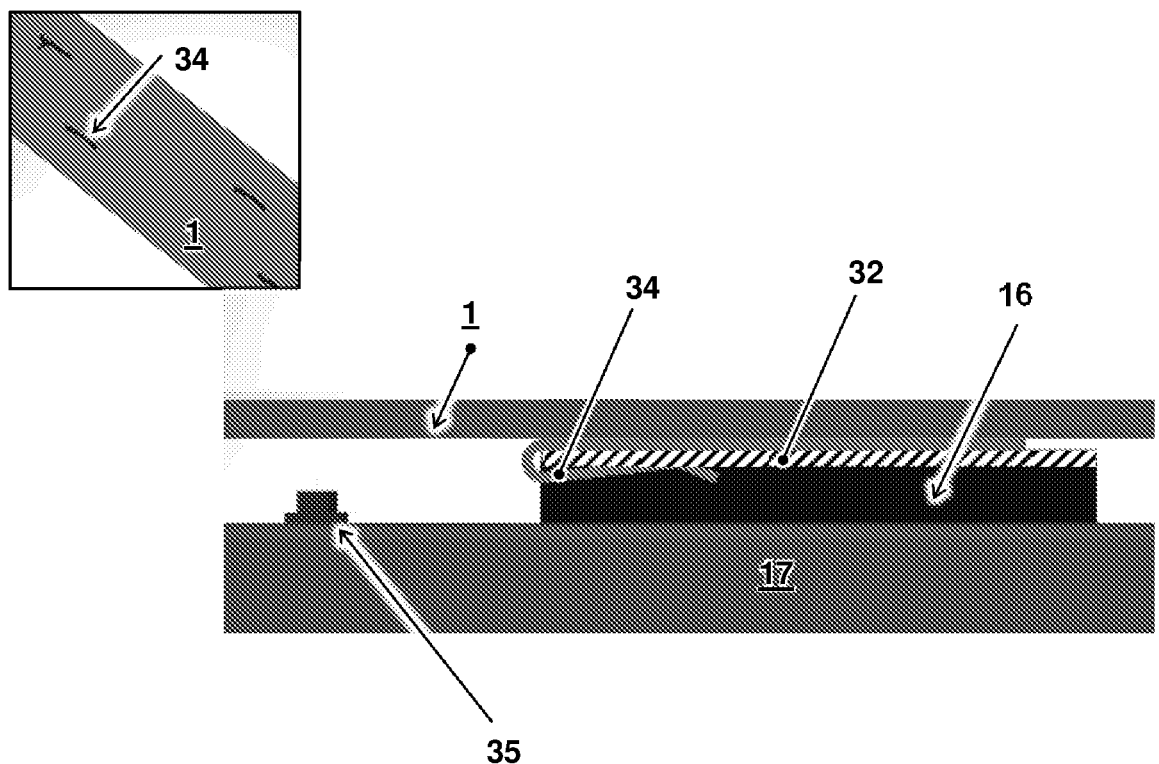
FIG. 7A schematically depicts a perspective and cross-section side view of a photovoltaic sandwich panel mounted to carrier.

Inventors found that, wind load may cause damage to panels mounted to a carrier. Particularly large photovoltaic sandwich panels (1), may be subject to damage, e.g. caused by wind load induced bending of mounted panels if mounted at or near the corners of the panel. To overcome such damage photovoltaic sandwich panels may be affixed to the carrier using one or more central locations on the panel, e.g. away from the corner and/or edge of the panel. Depending of the size of the panel and the maximum allowable load of the carrier a plurality of mounting positions may be used, e.g. a combination of mounting positions at or near a panel edge combined with one or more central mounting positions. Advantageously, as described herein feedthroughs F may be provided at a central location of photovoltaic sandwich panel 1. However tightening nuts and bolts, e.g. a central location of the panel may be challenging, particularly in situations with little clearance. In a preferred embodiment the photovoltaic sandwich panel 1 the provided with a means for attaching to a rail without tightening nuts and/or bolts. Preferably, said means may be attached to the rear side, i.e. the side that in use points away from incident sunlight. Preferably said means interlock, slide of click onto a rail. In some embodiments, said means are provided at a central location on the backside of the panel. FIG. 7A schematically depicts a perspective view (left) of a panel 1 provided with hooks 34 and a cross section side view (right) of such panel mounted to a carrier 17 via a rail 16. In a preferred embodiment, e.g. as shown the rail provides the clearance to overcome a bolt protruding from the carrier. In a preferred embodiment, e.g. as shown the hook slides over the portion 32 on the rail.

According to a further aspect the present disclosure relates to an assembly comprising at least a first and a second adjacent photovoltaic sandwich panel (1',1") as described herein and a rail for mounting the panels to a carrier 17.

Figure 7B:
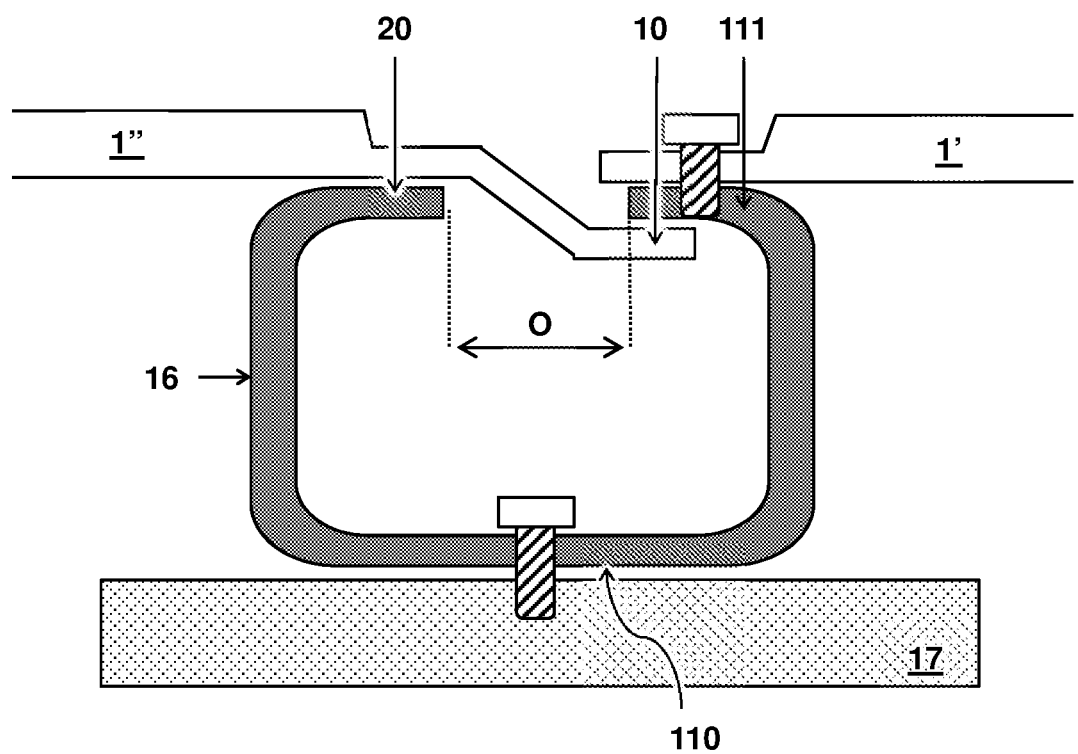
FIG. 7B schematically depicts a cross-section side view of photovoltaic sandwich panels mounted on a rail.

FIG. 7B schematically depicts a cross-section side view of an assembly comprising a first 1' and second 1" adjacent photovoltaic sandwich panels mounted on a carrier 17 via a rail 16. The rail comprises a first face 110 for mounting the rail to the carrier 17 and a second face separated at a distance from the first face with: a mounting region 111 for mounting the first panel 1'; support region 20 for holding the second panel 1"; and an opening O spreading between the mounting and support and extending under one or more of the mounting and support region such that the reinforced edge 10, preferably a shaped reinforced edge 10 of the first panel 1' may interlock into said opening O. By using said rail mounting of a plurality (e.g. assembly) photovoltaic sandwich panels 1 onto a carrier may be more efficient. For example, individual photovoltaic sandwich panels 1 may be fixed (e.g. bolted) to the rail on one end, e.g. on one end only. The other end may be affixed to the carrier via an interlocking mechanism. By using an interlocking mechanism the mounting time, and/or the mounting effort, may be reduced. Providing the rail with a first face for mounting to the carrier and a second face at a distance from the first face for mounting the photovoltaic sandwich panel 1 may mitigate mounting problems, e.g. due to unevenness in the carrier, e.g. roof. For example, said rail may allow mounting the photovoltaic sandwich panels 1 at a distance from the carrier, e.g. the roof. If the roof is uneven, e.g. comprises dents and/or bulges, mounting the panels at a distance may overcome these unevenness's. Providing the rail with a face for mounting to he carrier, e.g. as shown, may prevent water, e.g. rain, running off or between the adjacent panel from reaching the carrier. In other words, the assembly may be a water tight assembly to cover an opening in a building. When the assembly is used on or as a slanted roof the rails are preferably mounted in a direction along the slanting directing in a direction perpendicular to the rail reinforced edges 10 of adjacent panels preferably overlap.

Figure 8A:
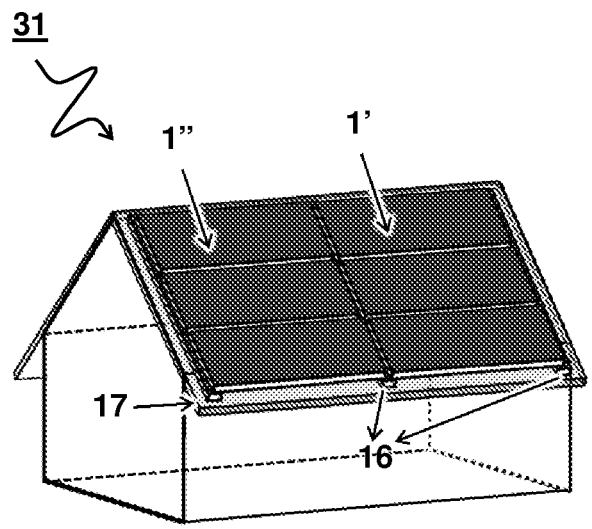
FIG. 8A and 8B schematically depict perspective views of an assembly of photovoltaic sandwich panels mounted on a roof.

FIG. 8A schematically depicts an assembly 31 of photovoltaic sandwich panels 1',1" mounted via a rail 16 to carrier 17, e.g. slanted roof of a house.

Figure 8B:
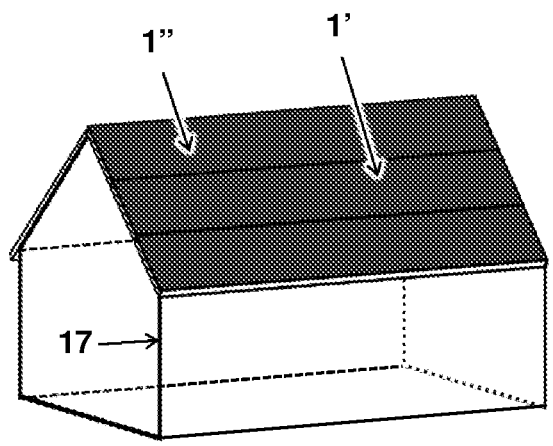

In other or further preferred embodiments, the photovoltaic sandwich panels 1 may be mounted directly to a carrier 17, e.g. without rail, e.g. as shown in FIG. 8B. Advantageously, photovoltaic sandwich panels as described herein may be used as construction elements, preferably a construction panel, e.g. a roof panel for closing a roof opening in a construction, e.g. building.

An assembly of a plurality of conventional solar celss, e.g. an assembly on a slanted roof, is typically provided, e.g. with one or more junction boxes. Such junction box typically comprises a by-pass diode which allows current from a string of cells, e.g. from one panel, to by-pass an adjacent string of cells, thus improving power out put of the assembly. Typically, the photovoltaic sandwich panel 1 is provided with an integrated bypass element. Suitable bypass elements include but are not limited to power MOSFETs such as a SM74611 Smart Bypass Diode, available from Texas Instruments©. Such components are typically designed to be included as alternatives to diodes in a junction box for a solar panel. Optionally Schottky diodes may be used as bypass elements. Inventors found MOSFET-based bypass elements are preferred since it was observed that Schottky diodes in an operational state of the panel generate comparatively more heat, reaching temperatures of about 40° C. above ambient temperatures.

Typically, for each string (usually with 20 or 24 cells, depending of panel size) one bypass is provided. In the preferred embodiment the bypass elements are integrated into the panel, i.e. the bypass element is included within the stack, preferably within a space provide in the fiber reinforced back layer 4. Integrating the bypass element allows manufacturing of panels wherein a bypass is provided for shorter strings of photovoltaic cells. Compared to a junction box provided with one bypass element per 20 or 24 cells, provision of a bypass element for shorter strings, e.g. one bypass element per 12, 10, or 8 cells, allows for further improvement of panel performance, particular under partially shadowy conditions. For example, the output of all cells a panel with a single string of 24 cells would be limited if only one of these cells is exposed to a shadow. In case cells in the panel are divided over a plurality of strings, e.g. 2 or 3, only the output of the cells within such a (shorter) single string may be affected. Furthermore, division of cells in shorter strings mitigates a possible formation of hot-shots within the panel. For example, if a panel is divided into comparatively smaller strings a comparatively smaller output current needs to pass a trajectory with a (temporary) increased electrical resistance; the output current of the remaining cells within the panel is transported over electrically separated wiring.

Figure 9A:
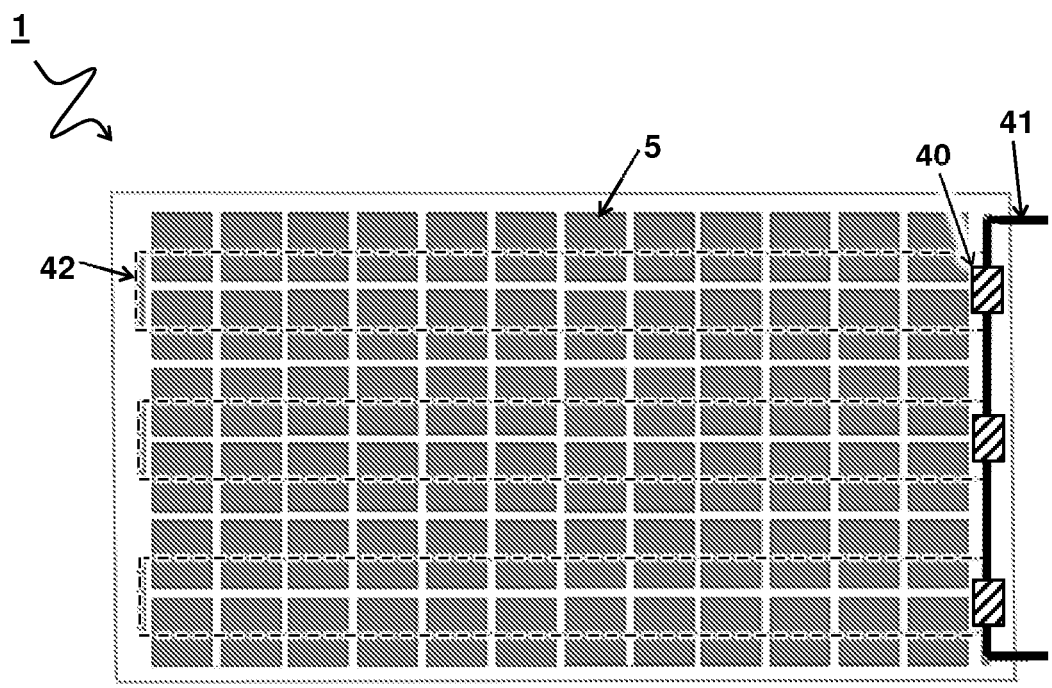
FIG. 9A, 9B and 10A schematically depict top-views of embodiments of a photovoltaic sandwich panel with integrated bypass elements.

FIG. 9A schematically depicts a top-view representation of a photovoltaic sandwich panel 1 comprising a main power line 41 (thick continuous line), three bypass elements 40, and three strings 42 (dashed lines), each including 24 photo-voltaic cells 5. During normal operation, power generated by the cells is collected at the terminal ends of main power line 21 with therein between all three strings connected in series. In that case, the bypass elements are not active; current over the main line does not by-pass a string. In case that one (or more) cells in a string (temporarily) have comparatively higher internal resistance, e.g. due to a localized shadow, or due to an internal damage in one of the cells, the bypass element 40 becomes conductive, so that (part of) the main power by-passes the affected string. In such way, hotspot formation at a position along the string may be avoided and/or a total output power of the panel may improve compared to a panel wherein all power passes the affected cell.

Figure 9B:
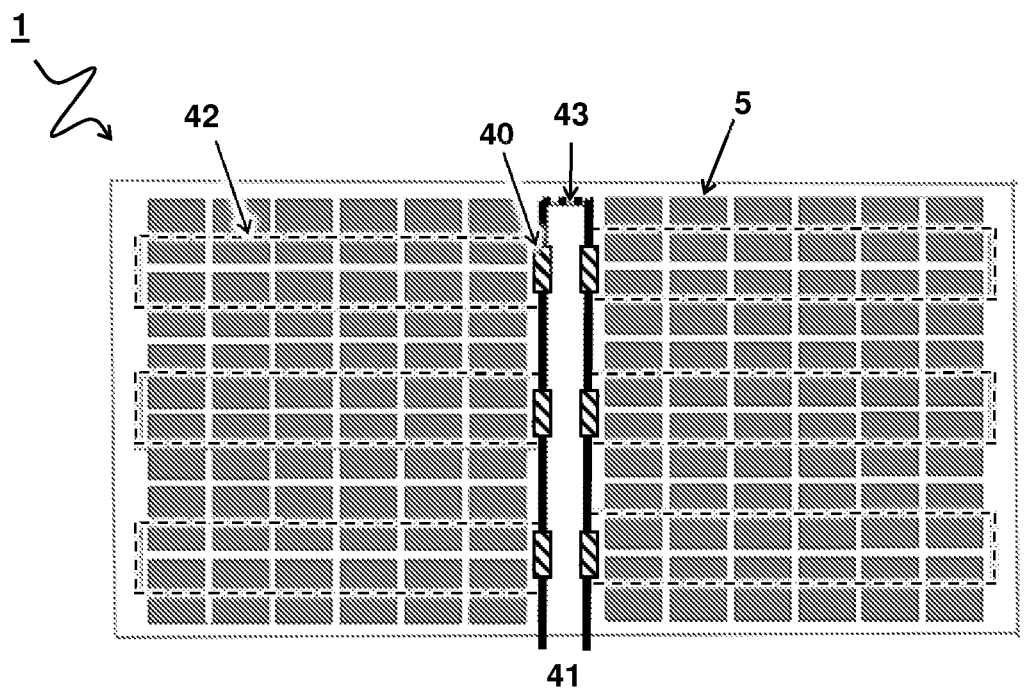

FIG. 9B schematically depicts a top-view image of another embodiment of a photovoltaic sandwich panel 1. This embodiment a has a layout wherein the main power line 41 runs along a central portion of the panel and wherein one bypass element 40 is provided per string 42 of twelve cells 5. The main power lines 41 has a respective main power line section at each side of the central portion of the panel and these main power line sections are electrically connected by interconnect 43 (dotted thick line). Such layout may be particularly preferred in embodiments (e.g. as in FIG. 3B or 4B wherein the cells are laid out in an arrangement enabling cutting or folding the panel along a pre-defined line. Note that in such embodiments, the interconnecting element 43 is preferably absent, thus effectively forming a panel having portions with electrically separated power harvesting circuits.

Figure 10A:
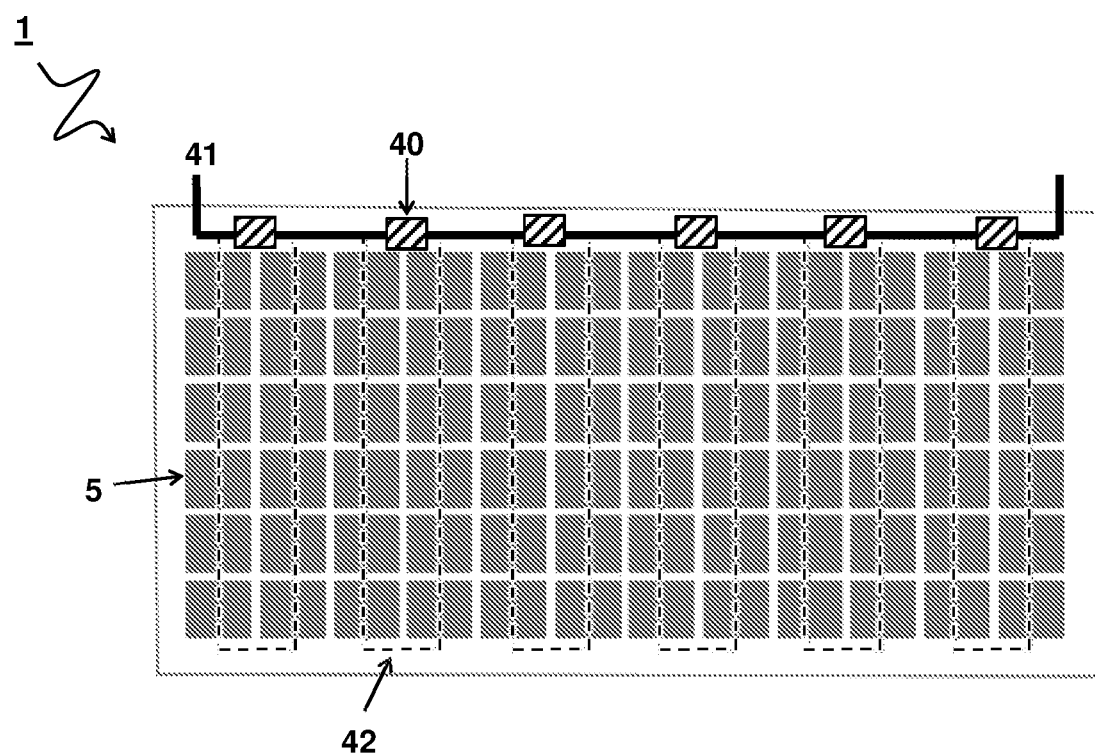

FIG. 10A schematically depicts a top-view image of an embodiment of a photovoltaic sandwich panel 1 wherein the main power line 41 is provided with one bypass element 40 per string 42 of twelve photovoltaic cells 5.

In contrast to the embodiments depicted in FIGS. 9A&B the cells in each string are oriented in a direction transverse to a length direction of the panel. By orienting the strings in the transverse direction of the panel, which is shorter than the length direction, a comparatively small number of cells may be included in a string. By way of example this becomes apparent from a comparison of the configuration of FIG. 10A, wherein the strings include 12 cells and the configuration of FIG. 9A, wherein the strings include 24 cells. Inventors found that the number of photovoltaic cells in a string is preferably not more than 24. More preferably, the number of cells in a string is below 15, e.g. 12 or 10 or even 6 or 8. Inventors found that in panels manufactured with strings of 12 cells wherein one of the cells is purposefully damaged before testing, the temperature in the front sheet remains well below about 130° C. which is below the melting temperature of the protective front layer 3.

The arrangement in which cells in each string are oriented in a direction transverse to a length direction of the panel is further particularly suitable for photovoltaic sandwich panels with a comparably large dimension in a length direction. As described herein, the method for manufacturing the photovoltaic sandwich panels according to the invention may be particularly suitable for manufacturing oversized panels, e.g. panels having a length L in range between 1 to 15 meters or more and a width W in a range between 0.5 and 2.5 meters. By orienting the strings in the direction transverse to the length direction of the panel, panel length can be adjusted without varying the number of cells in a string.

In a preferred embodiment, the photovoltaic sandwich panels according to the invention are provided with an integrated Maximum Power Point Tracking module (MPPT). Like the bypass element, the MPPT module may advantageously be integrated within the panel, e.g in the fiber reinforced back layer 4. Addition of a MPPT-module may obviate a need for bypass elements. Preferably, a thickness of the fiber reinforced back layer 4, e.g. the honeycomb panel 15, matches a thickness of the MPPT-module. Typically the thickness of the fiber reinforced back layer 4 is in a range between 8 and 20 mm, e.g. 10 or 15 mm, depending on the dimensioning of the panel. Keeping the thickness of the MPPT-module below a thickness of the fiber reinforced back layer 4, e.g. below 10 mm, may allow a complete embedding of the MPPT-module in the panel. It will be appreciated that MPPT-modules that are thicker than the fiber reinforced back layer 4 may be applied as well, albeit that such modules may partially protrude from a back surface of the panel. Inventors concluded that optimal results are obtained with one Power Point Tracking module per string of about 20-30 cells, e.g. about 24 cells. A number higher than 30 cells for each MPPT would be at the cost of efficiency, due to the fact that the loss of selectivity with which shadowed or damaged areas can be prevented from obstructing functioning of the panels. On the other hand a number lower than about 20 would not significantly contribute to that selectivity and merely increase the cost of the product. Multiple Power Point Tracking modules may be integrated, e.g two or three or more, onto a single PCB (printed circuit board), therewith reducing the number of required cut outs in the fiber reinforced back layer 4.

In an even more preferred embodiment, the Maximum Power Point Tracking module is provided with a communications unit. Advantageously, the Power Point Tracking Module may provide one or more of: module level shutdown; compliance to local regulations; module level performance diagnose; and module level performance monitoring. Module level shutdown, may allow an operator, or control module to shut down the panel, removing power from the wiring in case of a calamity (e.g. fire) or maintenance works. On demand shut down (e.g. power removal) is or may become a requirement according to local regulations.

According to a further aspect, the present disclosure relates to a method for manufacturing a photovoltaic sandwich panel 1. The method comprising: providing a photovoltaic elements 5; providing a protective front layer 3; providing a fiber reinforced back layer 4; adhering, preferably by laminating, the photovoltaic elements in a photovoltaic element layer 2 between the protective front layer 3 and the fiber reinforced back layer 4. In a preferred embodiment, the photovoltaic cells 5 may be provided in a photovoltaic element layer 2. Alternatively or in addition, the photovoltaic element layer 2 may be formed by laminating the photovoltaic cells 5 between two encapsulation foils 7. Optionally the photovoltaic cells may be encapsulated using a single, comparatively thicker, encapsulation foil. During laminating, i.e. under influence of heat and pressure, the encapsulation foil may deform, e.g. melt, and cover, e.g. surround the photovoltaic cells.

Preferably the method further comprises laminating the photovoltaic elements 5 or photovoltaic element layer 2 between the protective front layer 3 and the fiber reinforced back layer 4 with a encapsulation foil 7 between each pair of subsequent layers to form a stack S. Laminating, is preferably performed at temperature above a glass transition temperature of the encapsulation foils 7 and below a melting temperature of the protective front layer 3 and fiber reinforced back layer 4 for a time and at a lamination pressure sufficient to provide a good adhesion between the layers. Alternatively the stack S may be formed by gluing the photovoltaic cells 5 or photovoltaic element layer 2 between the protective front layer 3 and fiber reinforced back layer 4. In one embodiment the method is a continues production process.

In embodiments wherein the encapsulant is formed of a thermosetting composition, e.g. wherein the encapsulation foil comprises a thermally activated cross linking agent the temperature is preferably raised to a temperatures above an activation temperature (Tact) of the thermosetting composition, e.g. above an activation temperature of the cross-linking agent, and below a melting temperature of the fiber reinforced back layer 4 for a time and at a pressure, e.g. laminating pressure, sufficient to provide a good adhesion between the layers. As described herein above, the protective front layer may optionally or additionally be formed of a thermosetting composition, e.g. a composition comprising a cross linking agent.

Typically, the softening temperatures, e.g. melting temperatures of the encapsulant are in a range starting from about 90° C., e.g. from about 90 to 110° C., e.g. at about 95° C. or at about 100° C. However, encapsulants having a melting trajectory starting at 50° C. are also available. The activation temperature of the thermosetting composition, e.g. the activation temperature of the cross-linking agent, is selected as a temperature in a range from about 120 to about 160° C., e.g. about 140° or about 150° C. It will be appreciated that so long as the temperature remains below the activation temperature and above the softening temperature the encapsulation foil and/or protective front layer 3 are malleable. Only after reaching the activation temperature may the respective compositions obtain thermo-set character.

Inventors found that a contact temperature, e.g. during lamination, that is about 5° C. above the activation temperatures of the cross-linker provides good results, i.e. good adhesion between the layers in the stack without damaging (e.g. melting, or flowing) of the fiber reinforced back layer 4, e.g. the honeycomb panel 15. Accordingly, for a cross-linker with an activation temperature of 150° C. a suitable contact temperature is about 155° C. The upper limit for the contact temperature is defined by the temperature (and pressure) that results in damaging the fiber reinforced back layer 4. Inventors found that panels with a dimension of about 1 square meter require a relative contact pressure (e.g. during lamination) in a range between 0 and about 1000 mbar, typically about 100 to about 400 mbar, e.g. about 200 or about 300 mbar.

As described above, the front sheet may be provided with a micro-patterned relief structure. Advantageously, the relief structure may be provided without requiring a separate patterning step. For example, the relief structure may be provided by providing a suitable mould and contacting it to the outer face of the protective front layer 3 during laminating. To facilitate removal of the mould from the stack formed during laminating, the mould is preferably formed of, or its contact surface is preferably provided with, a non-stick polyfluorinated composition. Optionally, the relief structure may be applied in a separate processing step, e.g. after laminating the stack. For example, the relief structure may be applied by contacting the formed stack along a patterned surface of a heated drum.

In a preferred embodiment of the method the fiber reinforced back layer is a sandwich panel with a core layer defining a space of laterally connected pores. Preferably, the method further comprises evacuating said space. Evacuating the space of laterally connected pores as part of the lamination step may contribute to a pressure applied onto the stack during the lamination step. Applying a vacuum may mitigate lamination defects, e.g. adhesion defects, since volatile components (e.g. water) are removed from the stack.

In another or further embodiment, the method further comprises reinforcing the one or more of the edges of the laminated stack, wherein reinforcing is provided by one or more of: fusing (welding) together the protective front layer 3 and the fiber reinforced back layer 4; and fusing (welding) a reinforcement strip 8, to fuse the reinforcement strip 8 to the protective front layer 3 and fiber reinforced back layer 4. Welding may be provided by locally heating said one or more edges and/or reinforcement strip 8 to a temperature above the melting temperature of the protective front layer 3 and fiber reinforced back layer 4, and/or reinforcement strip 8. As described hereinabove in relation to the panel, therein welding may be performed by one or more of: a high intensity light beam, a heated mold, and a ultrasonic welding tool.

In some embodiments the method comprises, preferably subsequent to the step of laminating, reducing the thickness of the laminated stack of layers in an elongate region along a bending line B by heating the stack in said region to a temperature above a melting temperature of one or more of: the protective front layer 3 and the fiber reinforced back layer 4, to reduce the stiffness in the elongate region along the bending line B to allow bending of the photovoltaic panel to be formed without losing solar energy harvesting functionality. Heating may be performed by one or more of: a high intensity light beam, a heated mold, and an ultrasonic welding tool.

In some embodiments the method includes providing a feedthrough F to the photovoltaic sandwich panel. Accordingly the method comprises: providing a fiber reinforced thermoplastic tubule 9; making a hole in the photovoltaic sandwich panel 1 at a pre-defined location; rotating and pressing the tubule 9 aligned in its insertion direction into the hole to weld the tubule 9 to the protective front layer 3 and fiber reinforced back layer 4 wherein frictional heat generated from rotational energy dissipated between the tubule 9 and the photovoltaic sandwich panel 1 contributes to the formation of the weld. Preferably the tubule 9 is a conical shaped tubule 9 having an outer diameter reducing form a first value to a second value in an insertion direction, and wherein the hole has a diameter larger than the second value and smaller than the first value.

In a preferred embodiment, the method comprises integrating a bypass element 40 and/or maximum power point tracking module (MTTP) into the panel, preferably into the fiber reinforced back layer 4. Integrating the bypass element 40 and/or maximum power point tracking module (MTTP) may comprise providing one or more recesses in the fiber reinforced back layer 4. These recesses are suitably dimensioned for fitting the bypass elements 40 and/or MTTP modules. Further recesses, e.g. trenches, may be provided for accommodating the wiring, e.g. cabling for the main power line and/or cabling for connecting the cells within a string. The recesses may be provided by cutting, milling or, preferably by local heating of the backlayer of the fiber reinforced back layer 4 (e.g. honeycomb panel 15) to form a suitably dimensioned cavity. Local heating, e.g. melting of the fiber reinforced back layer was found to be particularly useful for back panels comprising a porous core layer (e.g. spacer layer) such as honeycomb sandwich panels. Application of heat to a face of the fiber reinforced back layer may result in heating of the thermoplastic polymer comprised in the layer to above its melting temperature, which may result in a formation of a cavity. Depending on the relative thickness of the fiber reinforced back layer and the bypass elements 40 and/or MTTP modules the recess may protrude down to an opposing face and therewith result in a cut out. The recesses, and in particular the cut outs, for accommodating the bypass elements 40 are preferably provided with a matching insert, preferably of thermoplastic composition. The insert may be glued or welded to the fiber reinforced back layer 4 to improve water tightness of the panel at that position, such as to, in use, prevent water (e.g. rain) from leaking into the panel from the back of the panel. It will be appreciated that the positioning, dimensioning and pattern in which the recesses, trenches, and/or cut outs are provided depends on the lay-out of the photovoltaic sandwich panel that is to be manufactured.

Integrating the bypass element 40 and/or maximum power point tracking module (MTTP) may further comprise placing the respective wiring in the respective recesses (trenches). After placing the wiring, the trench along with the wire is preferably sealed, e.g. water-proofed. Water-proofing may be provided by dosing a sealant. Suitable sealants include thermoplastic sealants such as polyolefin elastomer sealants which may be dosed from a thermal dosing pistol. After solidification of the sealant the wiring is secured in place whereby the sealant further serves as a strain relief for the wiring.

Integrating the bypass element 40 and/or maximum power point tracking module (MTTP) may further comprise placing a first layer of encapsulant, e.g. encapsulation foil. The encapsulant layer is preferably placed after placing and securing the wiring. The foil is preferably suitably provided with cut outs at positions corresponding to positions were wiring is to be connected to the bypass element 40 and/or MTTP modules and/or at positions matching locations were wiring is to be connected to the photo voltaic cells.

The electronic components (including photovoltaic cells) to be comprised in photovoltaic element layer are placed. onto the encapsulation foil After placing the photo voltaic cells, the respective components are connected, e.g. soldered, to the wiring. Alternatively, the method may include placing a pre-connected string of photovoltaic cells and/or other pre-connected times such as a main power-line including bypass elements 40 and/or MTTP modules.

After completing connecting the electrical wiring, a second sheet of encapsulation foil and the protective front layer 3 are placed over the assembly formed thus far to form the stack S as described above. As explained herein, a durable adhesion between the layers may be provided by heating the stack to a temperature above a softening point, preferably to a temperature above a glass transition temperature of the encapsulation foils and below a melting temperature of the protective front layer and fiber reinforced back layer for a time and at a pressure sufficient to provide a good adhesion between the layers.

Figure 10B:
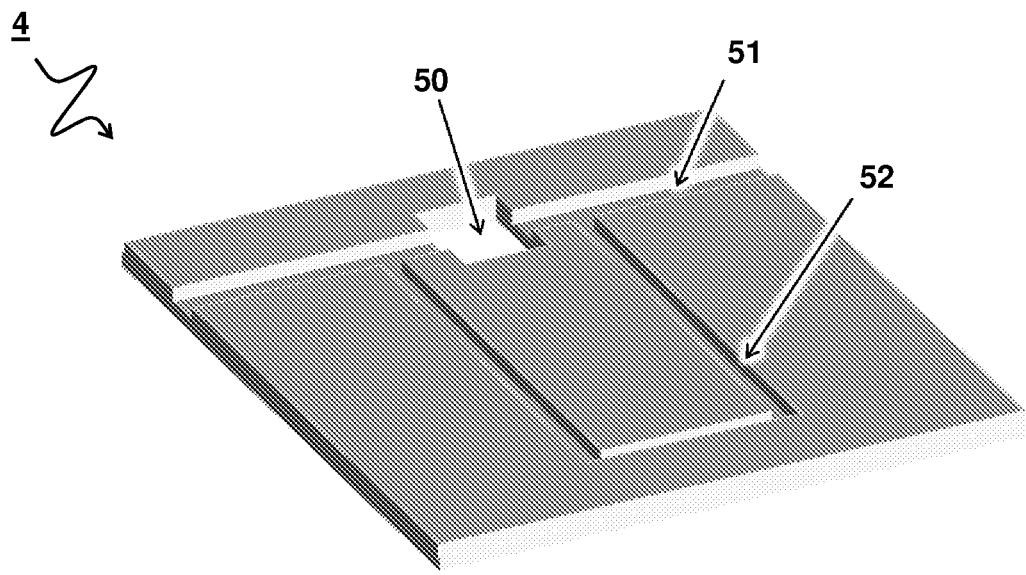
FIG. 10B schematically depicts a perspective view of a fiber reinforced back layer.

FIG. 10B depicts a schematic perspective view of a portion of a fiber reinforced back layer 4 provided with a recess 50 for fitting a bypass element 40, or to for fitting an insert to accommodate the bypass elements 40.The fiber reinforced back layer 4 as shown in FIG. 10B further is provided with a trench 51 for a main power line 41 and is also provide with a trench 52 for accommodating a power line connecting the cells within a string 42.

For the purpose of clarity and a concise description, features are described herein as part of the same or separate embodiments, however, it will be appreciated that the scope of the invention may include embodiments having combinations of all or some of the features described. For example, while embodiments are shown for photovoltaic sandwich panels 1 mounted on a roof, also alternative assemblies, e.g. in a field may be envisaged by those skilled in the art having the benefit of the present disclosure for achieving a similar function and result. Further, features pertaining to a micro-patterned relief structure may be combined with features pertaining to the inclusion of a cross-linker in the encapsulant and/or protective front layer. The various elements of the embodiments as discussed and shown offer certain advantages, such as a low weight, improved panel dimension, ease of fabrication, re-usability, and improved thermal stability. Of course, it will be appreciated that any one of the above embodiments or processes may be combined with one or more other embodiments or processes to provide even further improvements in finding and matching designs and advantages. It is appreciated that this disclosure offers particular advantages to panel manufacturing and panel assemblies, e.g. mounting, and in general can be applied for any application wherein photovoltaic sandwich panels are used.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

The invention claimed is:

1. A photovoltaic sandwich panel comprising a photovoltaic element layer provided between a protective front layer, and a fiber reinforced back layer, wherein:
   the photovoltaic element layer comprises photovoltaic cells,
   the protective front layer is formed from a compound comprising a first thermoplastic polymer,
   the fiber reinforced back layer comprises a second thermoplastic polymer with a fibrous filler material,
   the photovoltaic sandwich panel has a mass per surface area in a range between 2 and 10 kg/m2,
   the photovoltaic cells are encapsulated in a thermoplastic polyolefin (TPO) that has a melting temperature lower than a melting temperature of the protective front layer and the fiber reinforced back layer, and
   a thickness of the second thermoplastic polymer is reduced along a line across the panel and respective ends of the fiber reinforced back layer on either end of the line remain connected to each other via fibers of the fiber reinforced back layer.

2. The photovoltaic sandwich panel according to claim 1, wherein the fiber reinforced back layer is a sandwich panel comprising a core layer sandwiched between a fiber reinforced thermoplastic polymer top layer and a fiber reinforced thermoplastic polymer bottom layer,
   wherein the core layer is a porous spacer layer, and
   wherein the porous spacer layer comprises laterally connected pores.

3. The photovoltaic sandwich panel according to claim 2, wherein the core layer is a honeycomb panel that is formed entirely of thermoplastic polymers.

4. The photovoltaic sandwich panel according to claim 3, wherein the honeycomb panel is formed entirely of polypropylene.

5. The photovoltaic sandwich panel according to claim 3, wherein at least the protective front layer and the fiber reinforced back layer are fused at the edge of the panel over a width W to form a first edge portion of the photovoltaic sandwich panel as a reinforced edge with width W.

6. The photovoltaic sandwich panel according to claim 1, comprising a respective encapsulation foil between the photovoltaic element layer and the protective front layer and between the photovoltaic element layer and the fiber reinforced back layer, wherein a melting temperature and/or glass transition temperature of the encapsulation foils is below a melting temperature of the thermoplastic polymer comprised in the protective front layer and below a melting temperature of the thermoplastic polymer comprised in the fiber reinforced back layer.

7. The photovoltaic sandwich panel according to claim 6, wherein the fiber reinforced back layer is a sandwich panel comprising a core layer sandwiched between a fiber reinforced thermoplastic polymer top layer and a fiber reinforced thermoplastic polymer bottom layer,
   wherein the core layer is a porous spacer layer, and
   wherein the porous spacer layer comprises laterally connected pores.

8. The photovoltaic sandwich panel according to claim 1, wherein the thermoplastic polyolefin (TPO) is ethylene vinyl acetate (EVA).

9. The photovoltaic sandwich panel according to claim 8, wherein the protective front layer and the fiber reinforced back layer comprises polypropylene (PP).

10. The photovoltaic sandwich panel according to claim 1, wherein the protective front layer and the fiber reinforced back layer comprises polypropylene (PP).

11. The photovoltaic sandwich panel according to claim 10, wherein the fiber reinforced back layer comprises a glass fiber as a fibrous filler material.

12. The photovoltaic sandwich panel according to claim 1, wherein the fiber reinforced back layer comprises a glass fiber as a fibrous filler material.

13. The photovoltaic sandwich panel according to claim 1, wherein the core layer is honeycomb panel that is formed entirely of thermoplastic polymers.

14. The photovoltaic sandwich panel according to claim 13, wherein the honeycomb panel is formed entirely of polypropylene.

15. The photovoltaic sandwich panel according to claim 1, wherein the thermoplastic polyolefin (TPO) covers and surrounds the photovoltaic cells.

\* \* \* \* \*